(12) United States Patent
Terry

(10) Patent No.: US 7,277,687 B2
(45) Date of Patent: Oct. 2, 2007

(54) LOW POWER AMPLITUDE MODULATION DETECTOR

(75) Inventor: John David Terry, Santa Rosa, CA (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 327 days.

(21) Appl. No.: 10/727,263

(22) Filed: Dec. 3, 2003

(65) Prior Publication Data

US 2005/0124312 A1 Jun. 9, 2005

(51) Int. Cl.
*H04B 1/18* (2006.01)

(52) U.S. Cl. .................. 455/293; 455/337; 329/369

(58) Field of Classification Search .......... 455/280, 455/334, 337, 202–204, 293; 329/347, 362, 329/364, 369
See application file for complete search history.

(56) References Cited

U.S. PATENT DOCUMENTS

| | | | |
|---|---|---|---|
| 3,721,883 A | | 3/1973 | Whitmore et al. |
| 3,921,086 A | * | 11/1975 | Marek .................. 329/366 |
| 4,438,407 A | * | 3/1984 | Kemmesies ............ 329/311 |
| 5,630,216 A | | 5/1997 | McEwan |
| 6,366,164 B1 | * | 4/2002 | Hanselmann ........... 329/358 |
| 6,377,315 B1 | | 4/2002 | Carr et al. |
| 2003/0086583 A1 | | 5/2003 | Maltan et al. |
| 2003/0123686 A1 | | 7/2003 | Berger et al. |

FOREIGN PATENT DOCUMENTS

| | | | |
|---|---|---|---|
| DE | 3629597 A1 | * | 3/1998 |
| EP | 3629597 A | * | 3/1988 |
| FR | 1566613 | | 5/1969 |
| WO | WO-2005/057778 A1 | | 5/2005 |

OTHER PUBLICATIONS

"International Search Report for corresponding PCT Application No. PCT/US2004/040184", (Apr. 4, 2005), 3 pgs.

* cited by examiner

*Primary Examiner*—Nguyen T. Vo
(74) *Attorney, Agent, or Firm*—Schwegman, Lundberg, Woessner & Kluth P.A.

(57) ABSTRACT

An AM demodulator using totem pole complementary metal oxide semiconductor transistors having a feedback to provide a common gate voltage of approximately half that across the transistors in the totem pole. The AM demodulator used in a hearing assistance device and in a programmer of a hearing assistance device.

20 Claims, 3 Drawing Sheets

LOW POWER AMPLITUDE MODULATION DETECTOR

FIELD OF THE INVENTION

This application relates generally to radio communications, and more particularly to a low power amplitude modulation detector used for communications.

BACKGROUND

Radio communication electronics are increasingly found in devices used everyday. As communication electronics are added to more and more devices new features and technical challenges arise. Communications are supported between an ever increasing array of devices having a rich set of communications features. The movement to wireless devices will continue for some time.

One of the problems associated with the proliferation of communication electronics involves the space and power consumption of the electronics. Additionally, robust designs are needed to ensure reliable communications and low failure rates.

Thus, there is a need in the art for radio communication electronics that require smaller space and power consumption. The electronics should include robust circuits that provide reliable communications with elegant designs providing low cost construction and manufacturing overhead.

SUMMARY

This application addresses the foregoing need in the art and other needs not discussed herein. The various embodiments described herein relate to a low power and compact amplitude modulation (AM) detector. Some benefits of these embodiments include self-biasing, built-in RF carrier filtering using internal parasitic capacitance, adjustable AM detection gain, low power requirements, a relatively high input impedance, the incorporation of standard CMOS transistors, and the ability to independently configure the AM detector's rise and fall times to provide additional design versatility.

One aspect relates to an apparatus. According to various embodiments, the apparatus comprises a p-channel metal oxide semiconductor (PMOS) transistor having a first drain and a first source, and an n-channel metal oxide semiconductor (NMOS) transistor having a second drain and a second source. The first source of the PMOS transistor is connected to a first load at an output node. The first load has another connection to a first voltage reference. The second drain of the NMOS transistor is connected to the first drain of the PMOS transistor at a feedback node. The NMOS transistor has a second source connected to a second load. The second load has another connection to a second voltage reference. The first gate of the PMOS transistor and the second gate of the NMOS transistor are connected to a coupling capacitor. The coupling capacitor receives radio frequency input signals. The first gate and second gate receive a feedback from the feedback node.

One aspect relates to an apparatus comprising a microphone connected to a controller, a receiver connected to the controller, and an antenna connected to communication electronics. The communication electronics are connected to the controller. An embodiment of the communication electronics comprises a p-channel metal oxide semiconductor (PMOS) transistor having a first drain and a first source, and an n-channel metal oxide semiconductor (NMOS) transistor having a second drain and a second source. The first source of the PMOS transistor is connected to a first load at an output node. The first load has another connection to a first voltage reference. The second drain of the NMOS transistor is connected to the first drain of the PMOS transistor at a feedback node. The NMOS transistor has a second source connected to a second load. The second load has another connection to a second voltage reference. The first gate of the PMOS transistor and the second gate of the NMOS transistor are connected to a coupling capacitor. The coupling capacitor receives radio frequency input signals. The first gate and second gate receive a feedback from the feedback node.

One aspect relates to a method. According to various embodiments of the method, an amplitude modulated signal is received, and the amplitude modulated signal is processed with a capacitively coupled demodulator comprising a totem pole configuration of complementary metal oxide semiconductor transistors including a feedback signal to generate a demodulated signal.

This Summary is an overview of some of the teachings of the present application and not intended to be an exclusive or exhaustive treatment of the present subject matter. Further details about the present subject matter are found in the detailed description and appended claims. Other aspects will be apparent to persons skilled in the art upon reading and understanding the following detailed description and viewing the drawings that form a part thereof, each of which are not to be taken in a limiting sense. The scope of the present invention is defined by the appended claims and their legal equivalents.

BRIEF DESCRIPTION OF THE DRAWINGS

Various embodiments are illustrated by way of example and not by way of limitation in the figures of the accompanying drawings in which like references indicate similar elements.

DETAILED DESCRIPTION

In the following description, for purposes of explanation, numerous specific details are set forth in order to provide a thorough understanding of the various embodiments. It will be apparent, however, to one skilled in the art that the various embodiments may be practiced without some of these specific details. The following description and drawings provide examples for illustration, but are not intended in a limiting sense and are not intended to provide an exhaustive treatment of all possible implementations.

It should be noted that references to "an", "one", or "various" embodiments in this disclosure are not necessarily to the same embodiment, and such references contemplate more than one embodiment.

The present disclosure relates to wireless communication and in particular amplitude modulation (AM) detection. AM is one method of imparting information or "modulating" a radio signal for wireless communications. To create an amplitude modulated signal (AM signal) a carrier signal is modulated with amplitude variations representative of the information to be transmitted. The AM signal passes from a transmitter antenna to a receiver antenna.

Figure 1:
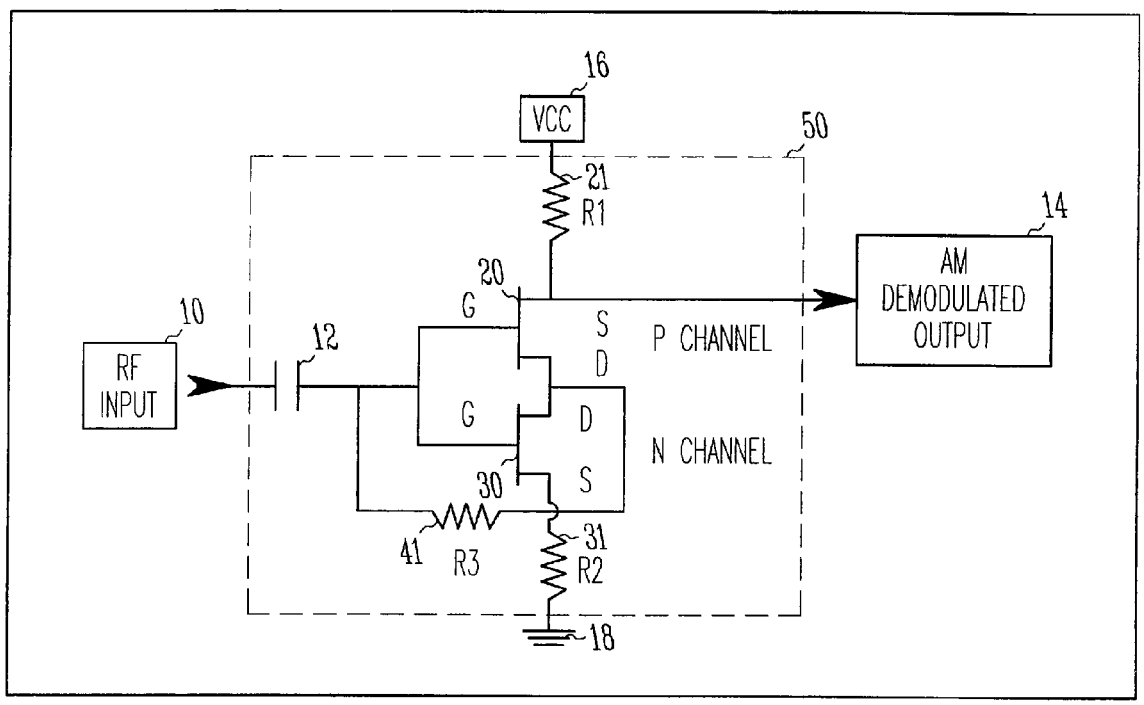
FIG. 1 relates to a low power AM detector according to one embodiment of the present invention.

FIG. 1 demonstrates an AM demodulator according to one embodiment of the present invention. A received AM signal is then passed to the demodulator circuit 50 shown in FIG. 1 as RF INPUT 10. According to one embodiment of the present invention, the AM signal passes through coupling capacitor 12 and is demodulated by the demodulator circuit 50 shown to provide a demodulated output 14. The demodulated output 14 is a signal with the information originally modulated by the transmitting system. In one embodiment, the demodulated output 14 is DC coupled. Other connections and components are possible without departing from the scope of the present design.

The circuit of FIG. 1 is implemented in varying embodiments. For example, in one embodiment the circuit of FIG. 1 is implemented on an integrated circuit. In one embodiment, transistors 20 and 30 are metal oxide semiconductor field effect transistors (MOSFETs). In one embodiment, transistor 20 is an P-channel metal oxide semiconductor (PMOS) and transistor 30 is a N-channel metal oxide semiconductor (NMOS). In one embodiment, transistor 20 and transistor 30 are complementary oxide semiconductor (CMOS) transistors. In one embodiment, the CMOS transistors are standard CMOS transistors.

In varying embodiments, the transistors have threshold voltages (Vt) of about 6 Volts, allowing a single primary battery to be used. However, the circuit is not limited to any particular threshold voltage. For example, the threshold voltages range from 0.2 to 5 Volts in other embodiments depending on the transistor design specifications and manufacturing process. The operating voltage VCC 16 in one embodiment is 1.2 Volts. However, it is understood that that VCC 16 may vary from 0.5 to 10 Volts in varying embodiments of the present circuit, depending on the type of transistor chosen. In one embodiment, a bipolar voltage supply provides the voltage across demodulator circuit 50. In such embodiments, the ground 18 is replaced with a negative voltage supply.

The relationship between the supply voltage applied to the demodulator circuit 50 and the threshold voltages of the transistors is such that the complementary transistors will self adjust the voltage across the gate and source each transistor's threshold voltage, ensuring that the transistor is conducting current between the drain and the source.

In varying embodiments, one or more of resistors R1, R2, and R3 are transistors connected as a resistive circuit element. In varying embodiments one or more of resistors R1, R2, and R3 are resistive elements. In varying embodiments, one or more of resistors R1, R2, and R3 are discrete resistors. Varying combinations are possible without departing from the scope of the present system.

In the embodiment provided by FIG. 1, resistor R1 is connected from the power supply 16 to the source S of PMOS transistor 20. Resistor R2 is connected from the source S of the NMOS transistor 30 to ground 18. Resistor R3 is connected from the gates G, connected in common, to the drain-to-source connection of the transistors 20 and 30.

In the embodiment of FIG. 1, resistors R1 and R2 are used to establish independent RC time constants. R2 sets the attack time and R1 sets the release time. The capacitance in the RC time constant is determined by the transistor geometry, bias condition, and load capacitance.

In an application where it is desired to provide a symmetrical output transient response, R1 and R2 are of equal value and typically 10 k to 100 k Ohms. For applications where it is desired to provide a fast attack time and slow release time, R1 will be set to a high resistance between 50-500 k Ohm and R2 will be set to 0 Ohms.

Resistor R3 provides a DC negative feedback setting the gate voltage between the voltage at source S of the PMOS 20 and the voltage at the source S of the NMOS 30. In various embodiments, the DC negative feedback sets the gate voltage at approximately half the voltage between the source S of the PMOS 20 and the source S of the NMOS 30.

R3 is typically between 50 k and 500 k Ohms. R3 is the feedback resistor and controls the demodulation gain and input impedance of the circuit. Raising R3 increases the demodulator gain and increases the input impedance of the circuit while lowering it has the opposite effect.

In this embodiment, the detector is inverting. Thus, an increase in the input RF signal results in a dropping voltage at the detector's output.

This embodiment provides a detector circuit to demodulate AM signals. Unlike AM diode detectors this design, in varying embodiments, provides two self-biasing N and P channel transistors in a totem pole configuration. The design provides an elegant, low cost, easy to simulate and more versatile detector than standard diode detectors. This design is self biasing and provides built in RF carrier filtering using internal parasitic capacitance. The design also provides an adjustable AM detection gain, extremely low power consumption, higher input impedance than a diode detector, and independently configurable detector rise and fall times for added versatility. The design in varying embodiments is compact and is implemented on an integrated circuit. In varying embodiments, the transistors are standard CMOS transistors. Other embodiments are possible without departing from the scope of the present invention.

The demodulator circuit 50 is shown with coupling capacitor 12, however, in alternate embodiments the coupling capacitor 12 is external to the remaining electronics of demodulator circuit 50.

In varying embodiments, the present design includes a frequency selection device in the input to select a band consistent with the desired carrier frequency of the incoming AM signal. In one embodiment, a tuning element is inserted between the antenna and the RF INPUT 10 to provide band limited RF signals to the RF INPUT 10.

In varying embodiments, the present design is used in any receiver to provide received AM communications. Various examples of use of the present design are demonstrated by additional embodiments as follows, but such examples are not intended to be exhaustive or inclusive of the applications of the present design in its varying embodiments.

Figure 2:
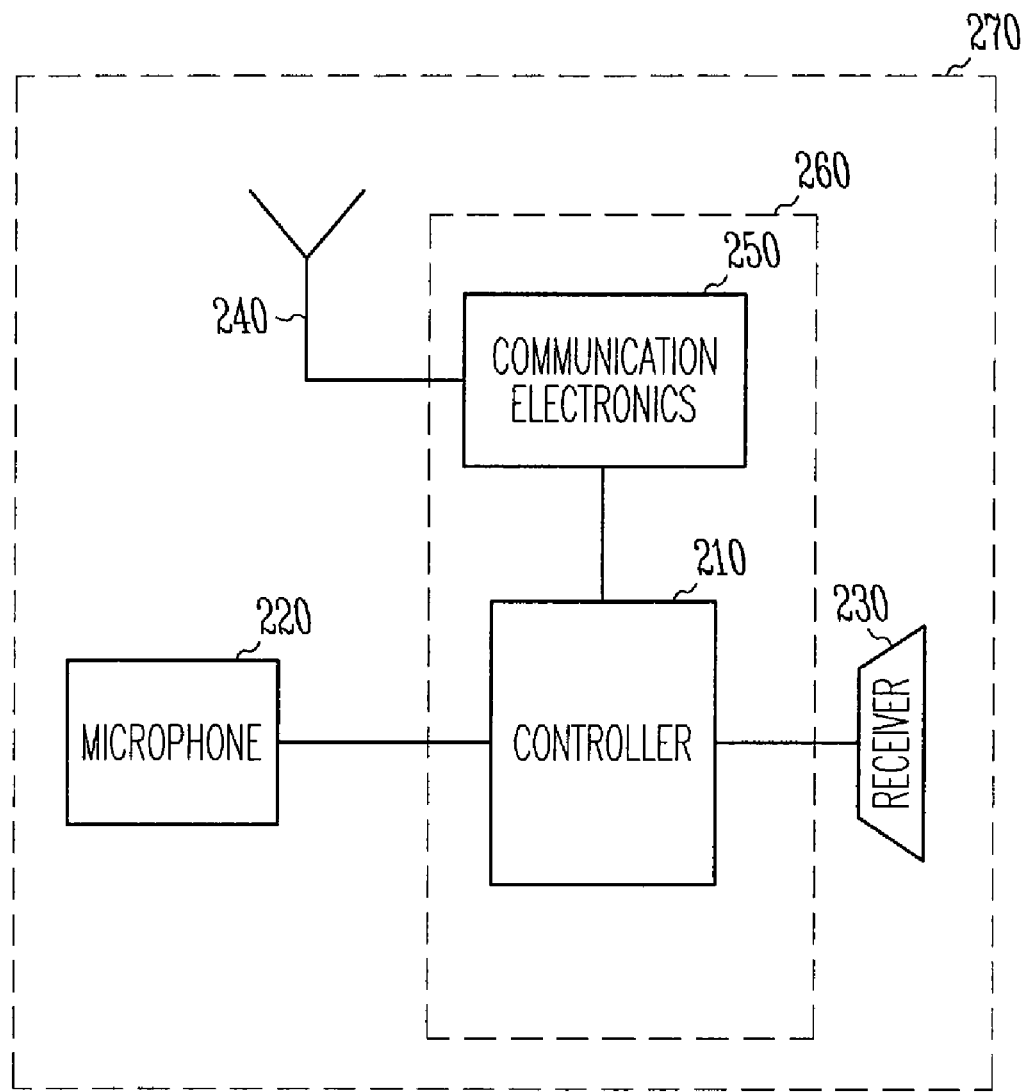
FIG. 2 demonstrates a low power AM detector in a hearing assistance device according to one embodiment of the present invention.

FIG. 2 demonstrates a low power AM detector in a hearing assistance device according to one embodiment of the present invention. Hearing assistance device 270 includes an antenna 240, communication electronics 250, controller 210, microphone 220 and receiver 230. The communication electronics 250 include an AM demodulator as discussed above in connection with FIG. 1 and in varying embodiments. In one embodiment, communication electronics 250 include a receiver section. In varying embodiments, communication electronics 250 include receiver and transmitter sections. In varying embodiments, the communication electronics 250 provide half-duplex communications. In varying embodiments, the communication electronics 250 provide full-duplex communications. Other embodiments are possible without departing from the scope of the present system.

In varying embodiments, device 270 includes a power supply (not shown) for controller 210 and for communications electronics 250. In varying embodiments, communication electronics 250 include hardware, and hardware and software for performing communications. In varying embodiments, communication electronics 250 are powered by an external source using reflective communications technology. In varying embodiments, controller 210 and communication electronics 250, denoted collectively as electronics 260, are implemented on an integrated circuit or hybrid circuit design. Various planar or non-planar substrate antennas 240 are also combinable in varying embodiments. Other applications, embodiments, and combinations of the foregoing are possible without departing from the scope of the present invention.

In one embodiment, hearing assistance device 270 is a hearing aid. In one embodiment, hearing assistance device 270 is an in the ear hearing aid. In one embodiment, hearing assistance device 270 is an over the ear hearing aid. In one embodiment, hearing assistance device 270 is a completely in the ear hearing aid. Other hearing assistance devices are possible without departing from the scope of the present system.

Figure 3:
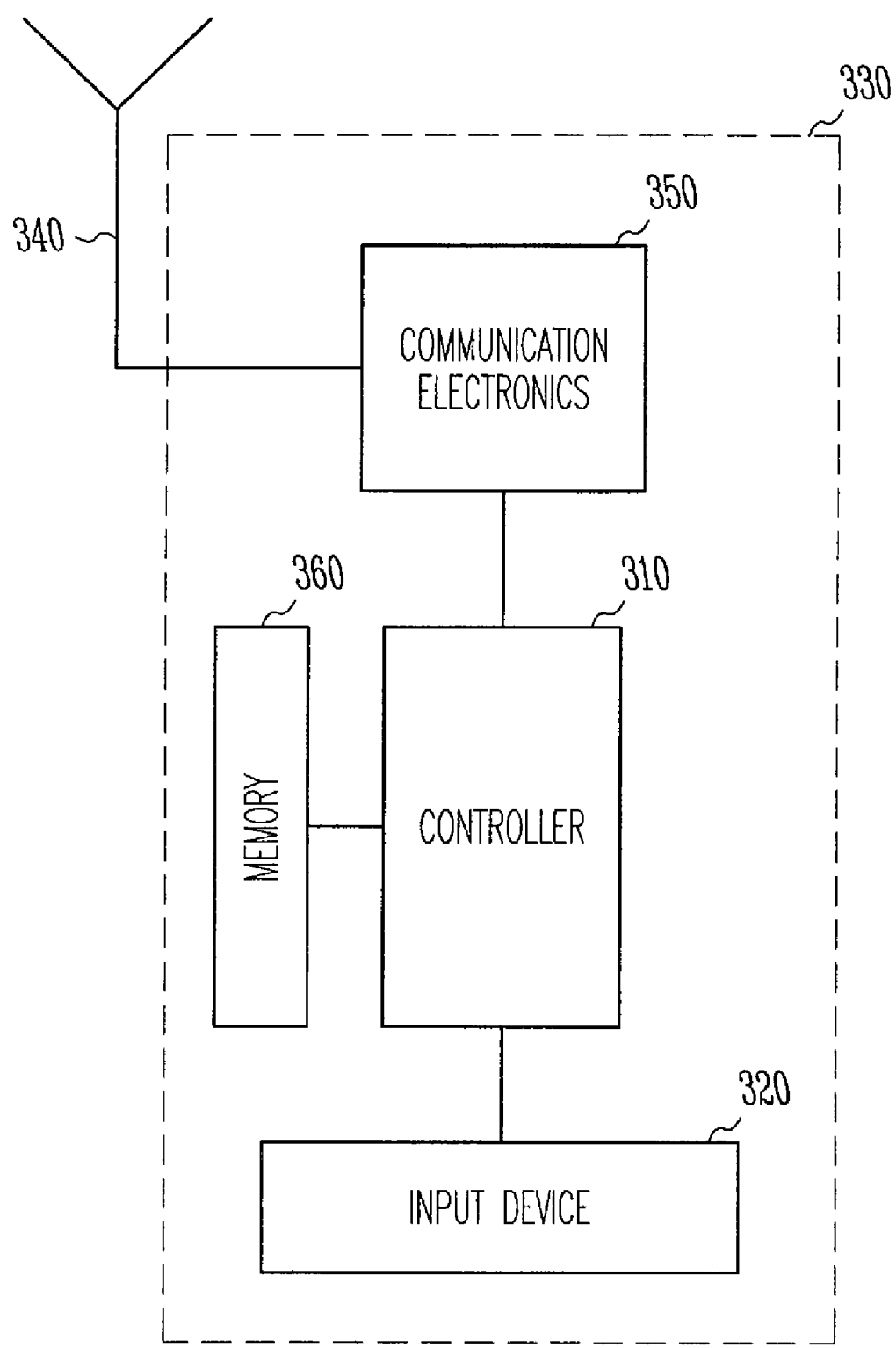
FIG. 3 demonstrates a low power AM detector in a wireless programming device according to one embodiment of the present invention.

FIG. 3 demonstrates a low power AM detector in a wireless programming device 330 according to one embodiment of the present invention. The wireless programming device 330 includes communication electronics 350, controller 310, memory 360, and input device 320. Antenna 340 is connected to the wireless programming device 330 and is optionally a component of the device 330. Different combinations and connections are possible and those shown herein are demonstrative and not intended to exhaustively or exclusively provide the embodiments of the present system. Not shown are various communication pathways, and power supplies.

In one embodiment, the communication electronics 350 include an AM demodulator as discussed above in connection with FIG. 1 and in varying embodiments. In one embodiment, communication electronics 350 include a receiver section. In varying embodiments, communication electronics 350 include receiver and transmitter sections. In varying embodiments, the communication electronics 350 provide half-duplex communications. In varying embodiments, the communication electronics 350 provide full-duplex communications. Other embodiments are possible without departing from the scope of the present system.

In varying embodiments, device 330 includes a power supply (not shown) for controller 310 and for communications electronics 350. In varying embodiments, communication electronics 350 include hardware, and hardware and software for performing communications. In varying embodiments, communication electronics 350 are powered by an external source using reflective communications technology. In varying embodiments, controller 310 and communication electronics 350 are implemented on an integrated circuit or hybrid circuit design. Various internal planar or non-planar substrate antennas 340 are also combinable in varying embodiments. In one embodiment, the programmer is a wireless programmer for programming hearing aids. Other applications, embodiments, and combinations of the foregoing are possible without departing from the scope of the present invention.

This description has set forth numerous characteristics and advantages of various embodiments and details of structure and function of various embodiments, but is intended to be illustrative and not intended in an exclusive or exhaustive sense. Changes in detail, material and management of parts, order of process and design may occur without departing from the scope of the appended claims and their legal equivalents.

What is claimed is:

1. An apparatus comprising:
a p-channel metal oxide semiconductor (PMOS) transistor having a first drain and further having a first source connected to a first load at an output node, the first load having another connection to a first voltage reference; and
an n-channel metal oxide semiconductor (NMOS) transistor having a second drain connected to the first drain of the PMOS transistor at a feedback node, the NMOS transistor having a second source connected to a second load, the second load having another connection to a second voltage reference,
wherein the first gate of the PMOS transistor and the second gate of the NMOS transistor are connected to a coupling capacitor, the coupling capacitor receiving radio frequency input signals and wherein the first gate and second gate receive a feedback from the feedback node.

2. The apparatus of claim 1, wherein the first load is a resistor.

3. The apparatus of claim 1, wherein the first load is a transistor.

4. The apparatus of claim 1, wherein the second load is a resistor.

5. The apparatus of claim 1 wherein the second load is a transistor.

6. The apparatus of claim 1, wherein the feedback comprises a signal passing through a third load.

7. The apparatus of claim 6, wherein the third load is a resistor.

8. The apparatus of claim 6, wherein the third load is a transistor.

9. The apparatus of claim 1, wherein the PMOS transistor and NMOS transistor are complementary metal oxide semiconductor (CMOS) transistors.

10. The apparatus of claim 1, wherein the first voltage reference is a positive supply voltage and the second voltage reference is a ground.

11. The apparatus of claim 1, wherein: the PMOS transistor and NMOS transistor are complementary metal oxide semiconductor (CMOS) transistors; the feedback includes a third load; the first load, second load, and third load are resistor-connected transistors; and the PMOS transistor, NMOS transistor, first load, second load, and third load are fabricated in an integrated circuit.

12. The apparatus of claim 11, wherein the first voltage reference is a positive supply voltage and the second voltage reference is a ground.

13. An apparatus, comprising:
a microphone connected to a controller;
a receiver connected to the controller; and
an antenna connected to communication electronics, the communication electronics connected to the controller and comprising:
a p-channel metal oxide semiconductor (PMOS) transistor having a first drain and further having a first source connected to a first load at an output node, the first load having another connection to a first voltage reference; and
an n-channel metal oxide semiconductor (NMOS) transistor having a second drain connected to the first drain of the PMOS transistor at a feedback node, the NMOS transistor having a second source connected to a second load, the second load having another connection to a second voltage reference, wherein the first gate of the PMOS transistor and the second gate of the NMOS transistor are connected to a coupling capacitor, the coupling capacitor receiving radio frequency input signals and wherein the first gate and second gate receive a feedback from the feedback node.

14. The apparatus of claim 13, wherein: the PMOS transistor and NMOS transistor are complementary metal oxide semiconductor (CMOS) transistors; the feedback includes a third load; the first load, second load, and third load are resistor-connected transistors; and the PMOS transistor, NMOS transistor, first load, second load, and third load are fabricated in an integrated circuit.

15. The apparatus of claim 14, wherein the first voltage reference is a positive supply voltage and the second voltage reference is a ground.

16. An apparatus, comprising:
a memory connected to a controller;
an input device connected to the controller; and
an antenna connected to communication electronics, the communication electronics connected to the controller and comprising:
a p-channel metal oxide semiconductor (PMOS) transistor having a first drain and further having a first source connected to a first load at an output node, the first load having another connection to a first voltage reference; and
an n-channel metal oxide semiconductor (NMOS) transistor having a second drain connected to the first drain of the PMOS transistor at a feedback node, the NMOS transistor having a second source connected to a second load, the second load having another connection to a second voltage reference, wherein the first gate of the PMOS transistor and the second gate of the NMOS transistor are connected to a coupling capacitor, the coupling capacitor receiving radio frequency input signals and wherein the first gate and second gate receive a feedback from the feedback node.

17. The apparatus of claim 16, wherein: the PMOS transistor and NMOS transistor are complementary metal oxide semiconductor (CMOS) transistors; the feedback includes a third load; the first load, second load, and third load are resistor-connected transistors; and the PMOS transistor, NMOS transistor, first load, second load, and third load are fabricated in an integrated circuit.

18. The apparatus of claim 17, wherein the first voltage reference is a positive supply voltage and the second voltage reference is a ground.

19. A method, comprising:
receiving an amplitude modulated signal; and
processing the amplitude modulated signal with a capacitively coupled demodulator comprising a totem pole configuration of complementary metal oxide semiconductor transistors including providing a feedback signal to a gate of each of the complementary metal oxide semiconductor transistors to generate a demodulated signal.

20. The method of claim 19, wherein the step of receiving comprises filtering the amplitude modulated signal.

* * * * *